United States Patent
Camera et al.

(10) Patent No.: US 6,362,664 B1
(45) Date of Patent: Mar. 26, 2002

(54) ACTIVE PULL-UP CIRCUIT

(75) Inventors: Alessandro Camera, Savona; Paolo Sandri, Milan, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/302,720

(22) Filed: Apr. 30, 1999

(30) Foreign Application Priority Data

Apr. 30, 1998 (IT) .......................................... TO98A0373

(51) Int. Cl.[7] ................................................. H03K 3/00
(52) U.S. Cl. ........................ 327/108; 327/309; 327/321; 326/82; 326/87
(58) Field of Search ................................ 327/108, 112, 327/309, 310, 321; 361/59, 61; 326/82, 83, 87

(56) References Cited

U.S. PATENT DOCUMENTS

| | | | | |
|---|---|---|---|---|
| 4,628,218 A | * | 12/1986 | Nakaizumi | 326/98 |
| 5,367,210 A | * | 11/1994 | Lipp | 326/83 |
| 5,489,861 A | * | 2/1996 | Seymour | 327/108 |
| 5,617,051 A | * | 4/1997 | Bingham | 327/379 |
| 5,952,875 A | * | 9/1999 | Yosefin et al. | 327/545 |

* cited by examiner

Primary Examiner—Timothy P. Callahan
Assistant Examiner—An T Luu
(74) Attorney, Agent, or Firm—Lisa K. Jorgenson; Stephen, Bongini, Fleit, Kain, Gibbons, Gutman & Bongini P.L.

(57) ABSTRACT

An active pull-up circuit for connection to an input pin that receives high and low logic level signals and a high voltage signal whose level is higher than the high logic level. The active pull-up circuit includes a pull-up circuit that is coupled between the input pin and a voltage supply line, and a breaking circuit that is coupled between the pull-up circuit and the voltage supply line. The pull-up circuit selectively brings the input pin to the level of the voltage supply line, and the breaking circuit operates to inhibit the pull-up circuit when the high voltage signal is on the input pin. In a preferred embodiment, the breaking circuit inhibits the pull-up circuit by electrically isolating the pull-up circuit from the voltage supply line. A method for selectively pulling-up an input node is also provided. According to the method, the input node is pulled-up to the level of a supply voltage at least when the input node receives a floating voltage, and such pulling-up of the input node is inhibited at least when the input node receives a high voltage signal whose level is higher than the level of the supply voltage.

22 Claims, 4 Drawing Sheets

ACTIVE PULL-UP CIRCUIT

CROSS-REFERENCE TO RELATED APPLICATIONS

This application is based upon and claims priority from prior Italian Patent Application No. TO-98-A000373, filed Apr. 30, 1998, the entire disclosure of which is herein incorporated by reference.

BACKGROUND OF THE INVENTION

1. Field of the Invention

The present invention relates to electronic circuits, and more specifically to an active pull-up circuit for an input that can receive a voltage that is higher than the supply voltage.

2. Description of Related Art

Conventional electronic circuits and integrated circuits have a certain number of input terminals or pins that can be used to make electric connections to transfer signals from the external environment to the circuit. The signals are typically logic signals with two voltage levels (e.g., 0 and 5 volts) and the input pin can have three different statuses: 0 volts, 5 volts, and a floating voltage (i.e., equivalent to the pin not being connected). With respect to the floating voltage status, in order to avoid an unpredictable status of the circuit, a pull-up function is usually implemented on the pin through a special circuit to quickly bring the voltage on the pin to the supply voltage (i.e., the high logic level V5 of 5 volts) when the input pin is disconnected and the voltage level is floating.

FIG. 1 shows an example of a conventional input circuit 1 that is formed using CMOS technology. As shown, an input pin IN supplies an input signal to a buffer circuit 2 that supplies an output signal to an output pin OUT. The buffer circuit 2 performs the usual separation functions of the voltage levels on the output pin OUT from the levels present on the input pin IN. A 5 volt voltage supply line VDD is connected to one of the supply pins 2VDD of the buffer circuit 2, and a ground node GND is connected to the other supply pin 2VDD. An active pull-up circuit PU is located between the input pin IN and the voltage supply line VDD.

The active pull-up circuit PU has a conventional current mirror circuit MR from which a current IP is drawn through a current generator I. The current mirror MR has two transistors: a P-channel injection transistor M2 with its gate electrode short-circuited with the drain electrode and a P-channel mirror transistor M1 connected through its gate electrode to the gate electrode of the injection transistor M2. The current IP is mirrored by the current mirror MR and injected into the input pin node IN. When a floating voltage level is present on the input pin IN (e.g., the input pin IN is disconnected), the current mirror MR brings the input pin IN to the level of the supply voltage.

Conventional active pull-up circuits such as the active pull-up circuit PU of FIG. 1 present some drawbacks when, in addition to the logic levels used by the circuit, a higher voltage (e.g., 15 volts) needs to be applied in order to communicate with downstream circuitry. For example, although downstream circuits may also operate during normal operation steps according to standard TTL logic levels (i.e., between 0 and 5 volts), the downstream circuits may include EPROM memory circuits that have a particular operation step of their own (e.g., a programming operation step) that requires a higher voltage such as 15 volts to be produced on their gate electrodes.

However, when such a 15 volt level is applied to the input pin, the mirror transistor M1 has a voltage of 15 volts on its drain electrode and 5 volts on its source electrode, so its drain-substrate junction is directly biased. Therefore, the mirror transistor enters a conduction state, and the 5 volt supply voltage and the 15 volt input voltage from the input pin have a conflict that can damage the circuits connected to the voltage supply line.

SUMMARY OF THE INVENTION

In view of these drawbacks, it is an object of the present invention to overcome the above-mentioned drawbacks and to provide an active pull-up circuit that has a more efficient and improved performance.

Another object of the present invention is to provide an active pull-up circuit that avoids a conflict between the supply voltage and the input voltage when the input voltage is higher than the supply voltage.

One embodiment of the present invention provides an active pull-up circuit for connection to an input pin that receives high and low logic level signals and a high voltage signal whose level is higher than the high logic level. The active pull-up circuit includes a pull-up circuit that is coupled between the input pin and a voltage supply line, and a breaking circuit that is coupled between the pull-up circuit and the voltage supply line. The pull-up circuit selectively brings the input pin to the level of the voltage supply line, and the breaking circuit operates to inhibit the pull-up circuit when the high voltage signal is on the input pin. In a preferred embodiment, the breaking circuit inhibits the pull-up circuit by electrically isolating the pull-up circuit from the voltage supply line.

Another embodiment of the present invention provides a method for selectively pulling-up an input node of a circuit that receives a supply voltage. According to the method, the input node is pulled-up to the level of the supply voltage at least when the input node receives a floating voltage, and such pulling-up of the input node is inhibited at least when the input node receives a high voltage signal whose level is higher than the level of the supply voltage. In one preferred method, either the pulling-up operation or the inhibiting of the pulling-up operation is performed based on the level on the input node.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
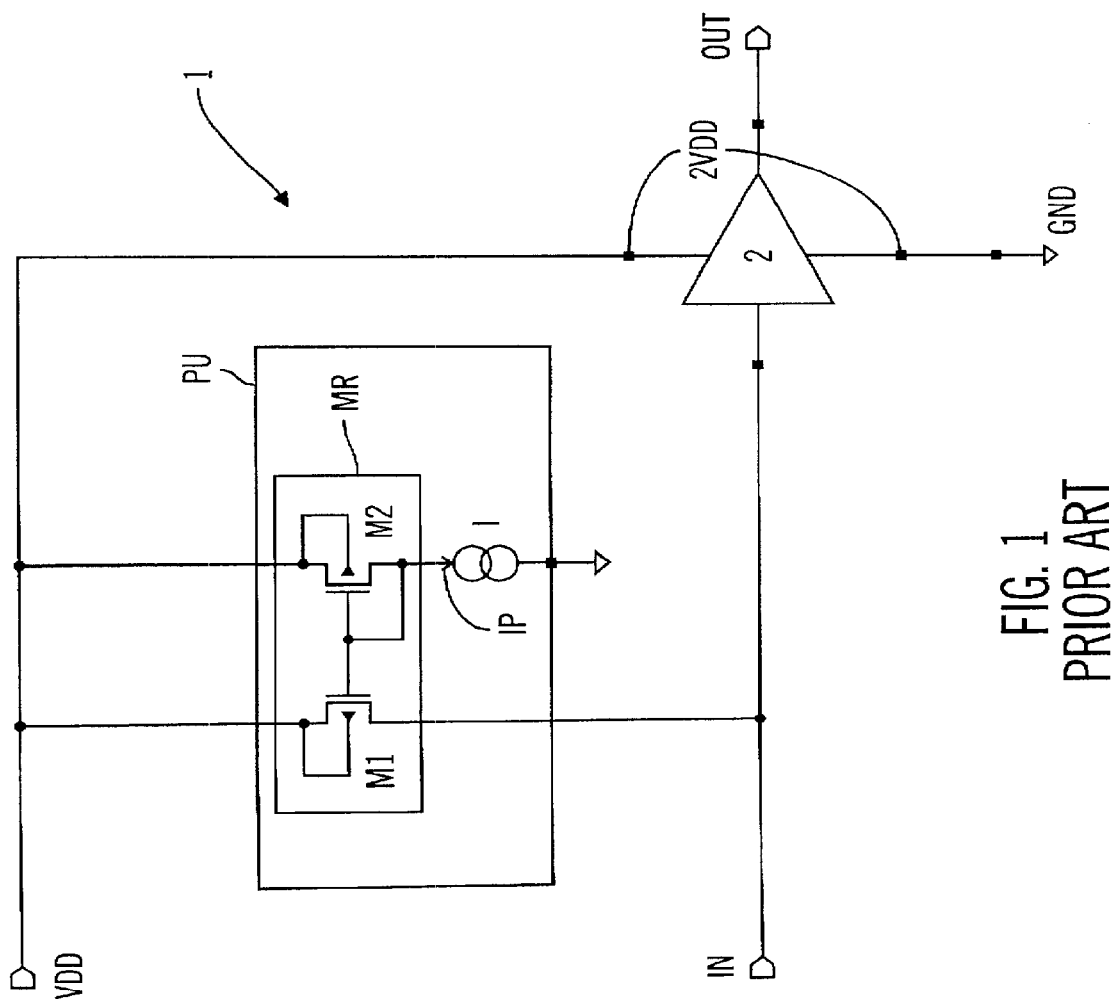
FIG. 1 shows a schematic diagram of a conventional active pull-up circuit.
Figure 2:
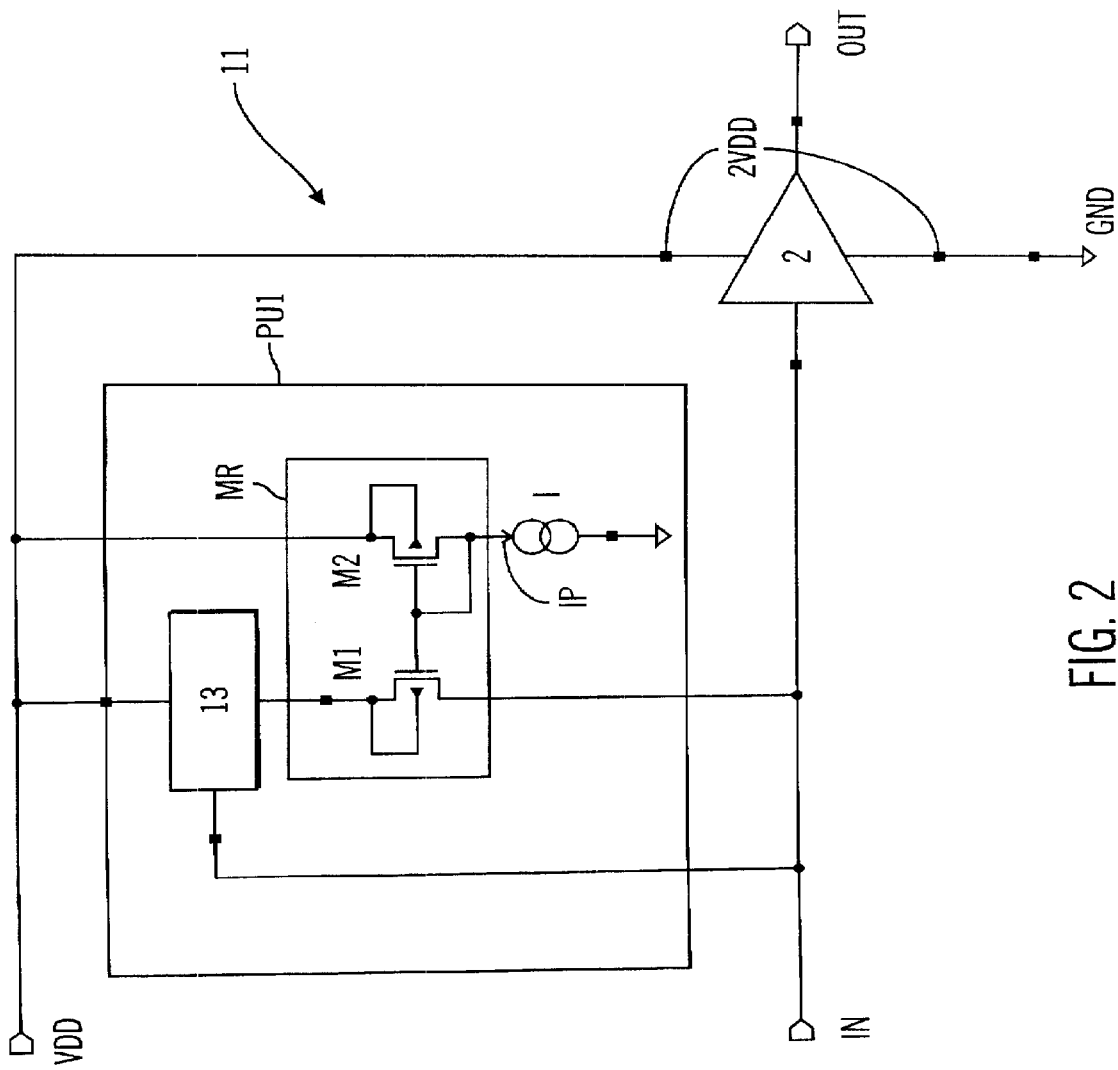
FIG. 2 shows a block diagram of an active pull-up circuit according to a preferred embodiment of the present invention.

FIG. 2 shows a block diagram of an input circuit 11 that is equipped with an active pull-up circuit PU1 according to a preferred embodiment of the present invention. As shown, the active pull-up circuit PU1 includes a current mirror MR that is similar to the current mirror of the active pull-up circuit PU of FIG. 1. Additionally, a breaking block 13 is provided between the source of the mirror transistor M1 and the voltage supply line VDD. The breaking block 13 is controlled by the voltage on the input pin IN.

During standard operation steps (i.e., when the voltage on the input pin IN is either at a low logic level V0 such as 0 volts, a high logic level V5 such as 5 volts, or a floating voltage level), the breaking block 13 behaves like a short circuit and the operation of the active pull-up circuit PU1 is entirely analogous to the operation of the active pull-up circuit PU of FIG. 1. However, if a second voltage level V15 (e.g., 15 volts) is present on the input pin IN such as to perform a programming operation on EPROM memories located downstream of the output pin OUT, the second voltage level V15 is supplied to the input of the breaking block 13 and causes the breaking block 13 to configure itself as an open circuit and thus inhibit operation of the current mirror MR, with a consequent exclusion of the active pull-up circuit PU1.

Figure 3:
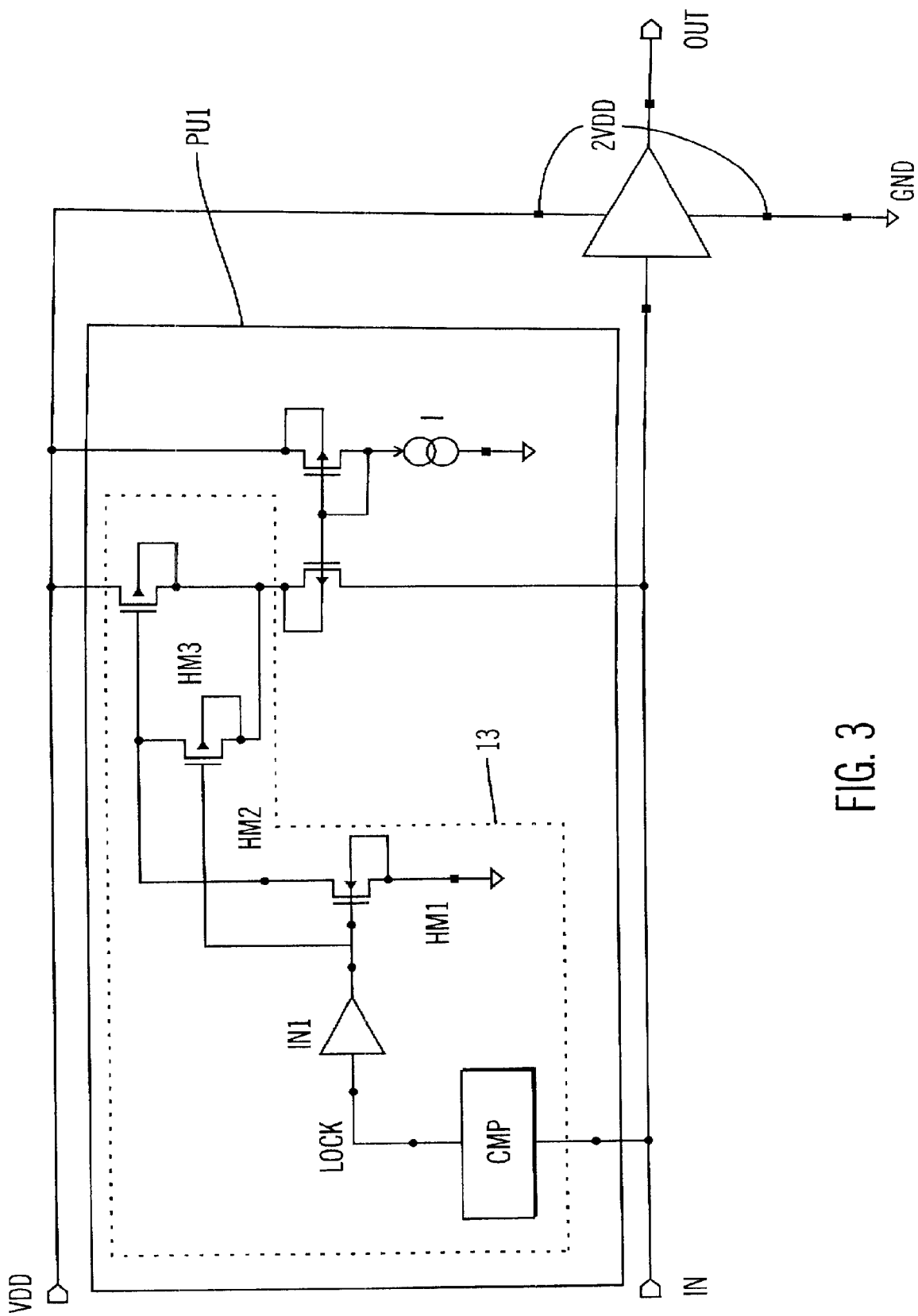
FIG. 3 shows a detailed schematic diagram of one embodiment of the active pull-up circuit of FIG. 2.

FIG. 3 shows a detailed schematic diagram of one embodiment of the active pull-up circuit PU1 of FIG. 2. The breaking block 13 is formed by a comparator block CMP that is connected to the input pin IN. At the output of the comparator block CMP, an enable logic signal LOCK is produced at the standard circuit logic levels (e.g., the low logic level V0 of 0 volts and the high logic level of 5 volts). The enable logic signal LOCK drives an inverter circuit IN1 whose output is connected to the gate electrodes of a first N-channel MOS transistor HM1 and a second P-channel MOS transistor HM2, which are connected in parallel.

The drain electrode of the first transistor HM1 and the source electrode of the second transistor HM2 are connected to the gate electrode of a third P-channel MOS transistor HM3, which is connected between the voltage supply line VDD and the current mirror MR through its source and drain electrodes, respectively. The drain electrode of the second transistor HM2 is connected to the drain electrode of the third transistor HM3. The three transistors HM1, HM2, and HM3 are designed to be capable of withstanding high voltages (e.g., 15 volts) between their gate and source. The comparator block CMP detects the voltage present on the input pin IN.

During standard operation steps, the enable logic signal LOCK is at a low logic level, so a high logic level V5 is present at the output of the inverter circuit IN1. This brings the first transistor HM1 into the conduction state, and thus the gate electrode of the third transistor HM3 is at the low logic level to cause the third transistor HM3 to go into the conduction state and enable operation of the current mirror MR. Moreover, the enable signal LOCK being at the low logic level inhibits the second transistor HM2. Thus, under such conditions, the operation of the pull-up circuit of FIG. 3 is analogous to the operation of the pull-up circuit of FIG. 1.

On the other hand, when the second voltage level V15 (e.g., 15 volts) is present on the input pin IN, the comparator block CMP outputs the enable logic signal LOCK at the high logic level V5. Thus, the gate electrode of the first transistor HM1 receives a low logic level V0 so the first transistor HM1 is inhibited. Further, the high level of the enable logic signal LOCK causes the second transistor HM2 to go into the conduction state. As explained with reference to FIG. 1, the mirror transistor M1 of the current mirror MR is in the conduction state, so the second voltage level V15, which has been decreased by the drop between the gate and source on the mirror transistor M1, reaches the drain electrode of the third transistor HM3.

Moreover, the second voltage level V15 is returned through the second transistor HM2 to the gate electrode of the third transistor HM3. Therefore, the third transistor HM2 is in an inhibition state to isolate the 5 volt voltage supply line VDD from the input pin IN, which is at the second (e.g., 15 volt) voltage level V15, and thus avoid a conflict. Additionally, the enable logic signal LOCK output from the comparator block CMP can be used by downstream circuits that only operate at the standard (TTL) logic levels to obtain information on the current operation step. The breaking block 13 can be substantially considered as being an inverter circuit (of the first transistor HM1 and second transistor HM2) that receives the enable logic signal LOCK and outputs an inverted signal with the amplitude of the second voltage level V15 to drive the third transistor HM3 in order to selectively isolate the current mirror MR.

Figure 4:
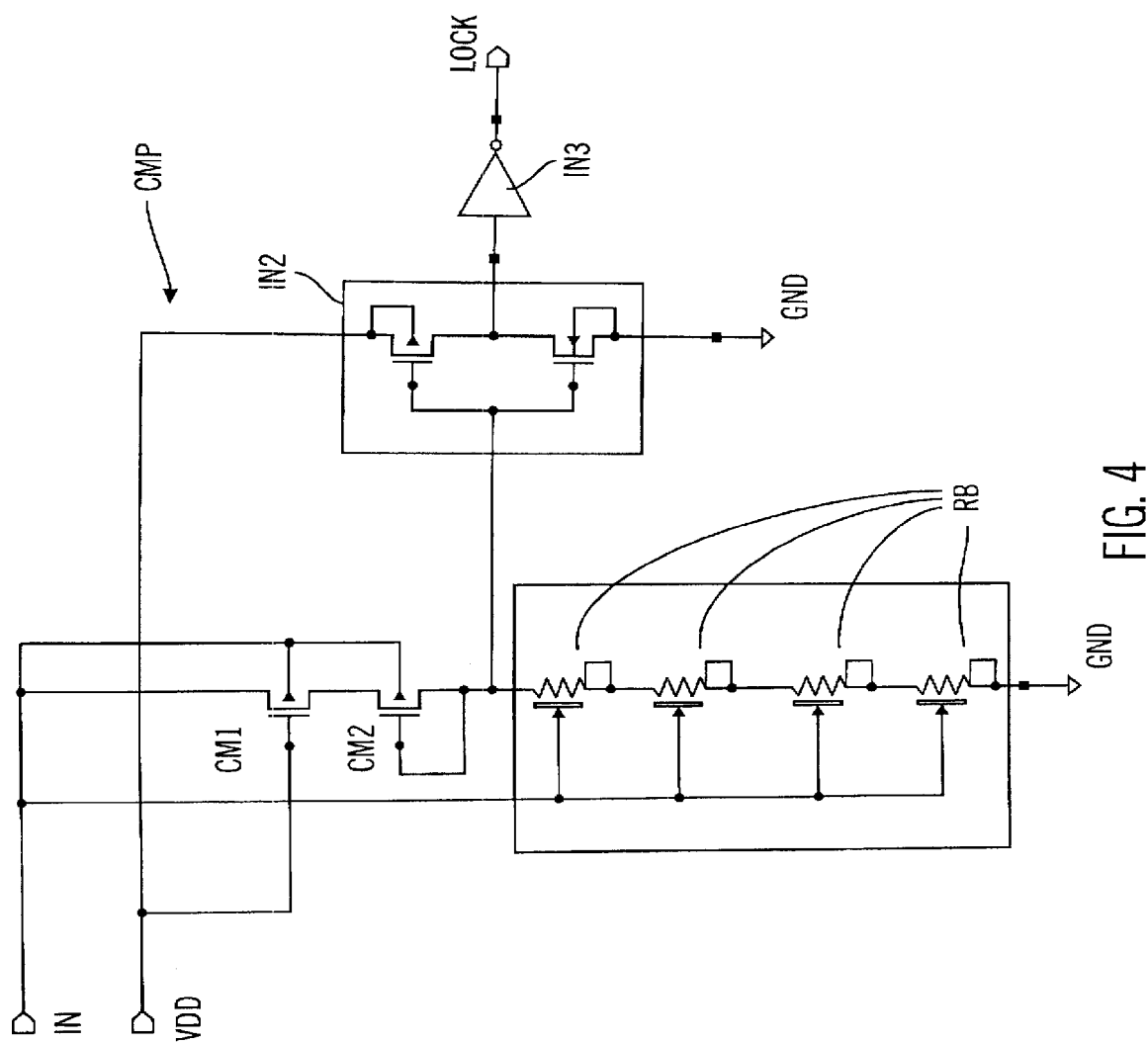
FIG. 4 shows a detailed schematic diagram of a portion of the active pull-up circuit of FIG. 3.

FIG. 4 shows a detailed schematic diagram of an exemplary embodiment of the comparator block CMP. As shown, the comparator block CMP includes a first P-channel MOS transistor CM1 that has its gate electrode connected to the voltage supply line VDD and its source connected to the input pin IN. A second P-channel MOS transistor CM2 acts as a load and is connected to the input of a first inverter IN2, which is followed by a second inverter IN3.

During standard operating steps, the first transistor CM1 is in the inhibited state so the input of the first inverter IN2 receives a low logic level, which is found again at the output of the second inverter IN3 as the enable logic signal LOCK. On the other hand, when the input pin IN receives a high voltage level V15 (e.g., 15 volts), the first transistor CM1 enters the conduction state and, through a resistor block RB that is connected to the input of the first inverter IN2, returns a voltage level that is sufficient to switch the output of the first inverter IN2. Thus, the output of the second inverter IN3 generates a high logic signal as the enable logic signal LOCK.

Accordingly, the active pull-up circuit of the present invention avoids any conflict between the pull-up voltage and the input voltage when the input voltage is greater than the pull-up voltage. More specifically, the pull-up circuit, which is not required under such conditions, is disabled to substantially isolate the supply from the input pin. Furthermore, the pull-up circuit of the present invention provides a logic signal containing information on the current operation step being performed, and this signal can be exploited by downstream circuits.

While preferred embodiments of the pull-up circuit of the present invention have been described above, the present invention is not limited to only those specific structures. For example, the circuit that performs the pull-up function may differ from the exemplary current mirror described above. In general, the pull-up circuit can be any circuit used for obtaining electric continuity between the voltage supply line and the input pin when a higher voltage level than the supply voltage level is present on the input pin. For example, the circuit may be formed by a simple self-biased pull-up transistor. Similarly, the exemplary voltage levels used in the above description can be changed or adapted as long as the devices that inhibit operation of the pull-up circuit can withstand such voltage level without being damaged or malfunctioning. Further, the comparator that detects the high level voltage can be formed through any voltage comparing circuit that can detect a difference between two voltage levels and supply an output logic signal.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An active pull-up circuit for connection to an input pin that receives high and low logic level signals and a high voltage signal whose level is higher than the level of a supply voltage, said active pull-up circuit comprising:
   a pull-up circuit coupled between the input pin and the supply voltage, the pull-up circuit selectively bringing the input pin to the level of the supply voltage; and
   a breaking circuit coupled between the pull-up circuit and the supply voltage,
   wherein the breaking circuit operates to inhibit the pull-up circuit when the high voltage signal is on the input pin, but does not operate to inhibit the pull-up circuit when the high logic level signal is on to input pin.

2. The active pull-up circuit as defined in claim 1, wherein the breaking circuit inhibits the pull-up circuit by electrically isolating the pull-up circuit from the voltage supply line.

3. The active pull-up circuit as defined in claim 2, wherein the breaking circuit includes a comparator that detects the level on the input pin and outputs an enable logic signal.

4. The active pull-up circuit as defined in claim 3,
   wherein the enable logic signal controls a plurality of transistors, and
   the plurality of transistors includes an isolating transistor that is coupled between the voltage supply line and the pull-up circuit.

5. The active pull-up circuit as defined in claim 4, wherein the plurality of transistors also includes two complementary transistors that operate to selectively pull-up the gate of the isolating transistor to the level of the high voltage signal.

6. The active pull-up circuit as defined in claim 3,
   wherein an isolating transistor is coupled between the voltage supply line and the pull-up circuit, and
   the breaking circuit includes an inverting drive circuit that receives the enable logic signal and drives the isolating transistor.

7. The active pull-up circuit as defined in claim 6, wherein the pull-up circuit includes a current mirror circuit.

8. The active pull-up circuit as defined in claim 3, wherein the enable logic signal is supplied to circuits that are located downstream of the active pull-up circuit.

9. The active pull-up circuit as defamed in claim 1, wherein the pull-up circuit includes a current mirror circuit.

10. An active pull-up circuit for connection to an input pin that receives high and low logic level signals and a high voltage signal whose level is higher than the high logic level, said active pull-up circuit comprising:
   a pull-up circuit coupled between the input pin and a voltage supply line that is at the high logic level, the pull-up circuit selectively bringing the input pin to the level of the voltage supply line; and
   a breaking circuit coupled between the pull-up circuit and the voltage supply line,
   wherein the breaking circuit operates to inhibit the pull-up circuit when the high voltage signal is on the input pin, and
   the breaking circuit includes a comparator that detects the level on the input pin and outputs an enable logic signal.

11. The active pull-up circuit as defined in claim 1, wherein the breaking circuit is controlled by the level on the input pin.

12. An integrated circuit that receives a supply voltage, the integrated circuit including at least one input pin and an active pull-up circuit that is connected to the input pin, the input pin receiving high and low logic level signals and a high voltage signal whose level is higher than the level of the supply voltage, said active pull-up circuit comprising:
   a pull-up circuit coupled between the input pin and the supply voltage, the pull-up circuit selectively bringing the input pin to the level of the supply voltage; and
   a breaking circuit coupled between the pull-up circuit and the supply voltage,
   wherein the breaking circuit operates to inhibit the pull-up circuit when the high voltage signal is on the input pin, but does not operate to inhibit the pull-up circuit when the high logic level signal is on the input pin.

13. The integrated circuit as defined in claim 12, wherein the breaking circuit inhibits the pull-up circuit by electrically isolating the pull-up circuit from the supply voltage.

14. An integrated circuit that receives a supply voltage, the integrated circuit including at least one input pin and an active pull-up circuit that is connected to the input pin, the input pin receiving high and low logic level signals and a high voltage signal whose level is higher than the level of the supply voltage, said active pull-up circuit comprising:
   a pull-up circuit coupled between the input pin and the supply voltage, the pull-up circuit selectively bringing the input pin to the level of the supply voltage; and
   a breaking circuit coupled between the pull-up circuit and the supply voltage,
   wherein the breaking circuit operates to inhibit the pull-up circuit when the high voltage signal is on the input pin, and
   the breaking circuit includes a comparator that detects the level on the input pin and outputs an enable logic signal.

15. The integrated circuit as defined in claim 14,
   wherein the enable logic signal controls a plurality of transistors, and
   the plurality of transistors includes an isolating transistor that is coupled between the supply voltage and the pull-up circuit.

16. The integrated circuit as defined in claim 15, wherein the plurality of transistors also includes two complementary transistors that operate to selectively pull-up the gate of the isolating transistor to the level of the high voltage signal.

17. The integrated circuit as defined in claim 14,
   wherein an isolating transistor is coupled between the supply voltage and the pull-up circuit, and
   the breaking circuit includes an inverting drive circuit that receives the enable logic signal and drives the isolating transistor.

18. The integrated circuit as defined in claim 12, wherein the pull-up circuit includes a current mirror circuit.

19. The integrated circuit as defined in claim 12, wherein the breaking circuit is controlled by the level on the input pin.

20. A method for selectively pulling-up an input node of a circuit that receives a supply voltage, the input node receiving high and low logic level signals and a high voltage signal whose level is higher than the level of the supply voltage, said method comprising the steps of:

pulling-up the input node to the level of the supply voltage at least when the input node receives a floating voltage;

inhibiting such pulling-up of the input node at least when the input node receives the high voltage signal; and not inhibiting such pulling-up of the input node at least when the input node receives a signal whose level is substantially equal to the level of the supply voltage.

21. A method for selectively pulling-up an input node of a circuit that receives a supply voltage, the input node receiving high and low logic level signals and a high voltage signal whose level is higher than the level of the supply voltage, said method comprising the steps of:

pulling-up the input node to the level of the supply voltage at least when the input node receives a floating voltage; and inhibiting such pulling-up of the input node at least when the input node receives the high voltage signal, wherein the inhibiting step includes the sub-steps of: detecting the level on the input node; and outputting an enable logic signal.

22. The method as defined in claim 20, further comprising the step of performing either the pulling-up step or the inhibiting step based on the level on the input node.

* * * * *